(12) United States Patent
Douseki et al.

(10) Patent No.: US 6,624,666 B2
(45) Date of Patent: Sep. 23, 2003

(54) DIFFERENTIAL TYPE LOGIC CIRCUIT

(75) Inventors: Takakuni Douseki, Atsugi (JP);
Toshishige Shimamura, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 44 days.

(21) Appl. No.: 09/867,677

(22) Filed: May 31, 2001

(65) Prior Publication Data
US 2001/0048324 A1 Dec. 6, 2001

(30) Foreign Application Priority Data

May 31, 2000 (JP) ........................................ 2000-162839
May 22, 2001 (JP) ........................................ 2001-152716

(51) Int. Cl.[7] ............................................. H03K 19/094
(52) U.S. Cl. ........................ 326/115; 326/27; 326/121
(58) Field of Search ................................ 326/115, 119, 326/122, 83, 86, 121, 26–28

(56) References Cited

U.S. PATENT DOCUMENTS

| 3,970,950 | A | * | 7/1976 | Freeman et al. ............ 330/253 |
| 5,264,744 | A | * | 11/1993 | Mizukami et al. ............ 326/83 |
| 5,594,371 | A | * | 1/1997 | Douseki ...................... 326/119 |
| 5,821,769 | A | * | 10/1998 | Douseki ...................... 326/121 |
| 6,100,720 | A | * | 8/2000 | Kumagai et al. ............ 326/121 |
| 6,111,427 | A | * | 8/2000 | Fujii et al. .................. 326/121 |

FOREIGN PATENT DOCUMENTS

JP          8-204541          * 8/1996

OTHER PUBLICATIONS

Dependence of CMOS/SIMOX Inverter Delay Time on Gate Overlap Capacitance, Douseki et al., IEICE Trans, Electron, vol. E76–C, No. 8, Aug. 1993.

* cited by examiner

Primary Examiner—Don Le
(74) Attorney, Agent, or Firm—Venable; Michael A. Sartori

(57) ABSTRACT

To achieve a differential type logic circuit operating at a high speed and with a low voltage, the circuit is composed of a differential push-pull circuit comprising enhancement type NMOSFETs and depletion type NMOSFETs and a CMOS inverter pair circuit comprising inverters, and a threshold voltage of FETs of the CMOS inverter pair circuit is set to a value same as or greater than a threshold voltage of enhancement type FETs of the differential push-pull circuit and smaller than about ½ of supply voltage.

32 Claims, 10 Drawing Sheets

VDD=0.5V, Vthd=-0.2V, Vthe=0V

| | MAXIMUM OPERATION FREQUENCY (GHz) | POWER CONSUMPTION (μW/GHz) |
|---|---|---|
| FREQUENCY DIVIDER OF PRIOR ART CMOS CONFIGURATION | 2.5 | 116.8 |
| FREQUENCY DIVIDER OF FIG.4B | 4.5 | 86.9 |
| FREQUENCY DIVIDER OF FIG.5B | 5.1 | 91.4 |

FIG.8

| INPUT | | OUTPUT | |
|---|---|---|---|
| CK | Vin | Vout(t+1) | VoutB(t+1) |
| 0 | 0 | Vout(t) | VoutB(t) |
| 0 | 1 | Vout(t) | VoutB(t) |
| 1 | 0 | 0 | 1 |
| 1 | 1 | 1 | 0 |

FIG.9

DIFFERENTIAL TYPE LOGIC CIRCUIT

This application is based on Patent Application Nos. 2000-162839 filed May 31, 2000 and 2001-152716 filed May 22, 2001 in Japan, the content of which is incorporated hereinto by reference.

BACKGROUND OF THE INVENTION

1. Field of the Invention

The present invention relates to an ultra-low power consumption differential type logic circuit capable of performing high-speed operation at a low power supply voltage of less than or equal to 1V.

2. Description of the Related Art

In a high-speed CMOS logic circuit such as a frequency divider or the like, high-speed operation at a decreased power supply voltage is effective in view of reduced power consumption. A conventional CMOS inverter circuit comprises an enhancement type PMOSFET and an NMOSFET.

In this circuit, in the case of being operated at a high speed with a low power supply voltage, when the amplitude of the input signal is decreased to lower than the power supply voltage, since amplification action is performed up to the power supply voltage level by the CMOS inverter circuit, this results in an increased delay time. Further, even when the amplitude of the input signal is at the power supply voltage level, a delay time due to a capacity Cm between input and output of the CMOS inverter circuit is a substantial bottleneck (for example, Douseki et al., IEICE Trans. Electron, Vol. E76-C, No. 8, pp. 1325–1332, August 1993). This is because the capacity Cm between gate and drain of the two FET constituting the CMOS inverter circuit functions as Miller effect which equivalently increases a load capacity $C_L$ and increases the delay time.

Then, to prevent the delay time from increasing, capacity between gate and drain of the FET may be reduced, however, by this technique, an addition of a specific process such as improving the device structure is required. In particular, in a SOI (Semiconductor On Insulator) device having a small load capacity, since the proportion of capacity between gate and drain in the total capacity is high, the delay time due to capacity between gate and drain substantially hinders improvement of the speed performance.

SUMMARY OF THE INVENTION

An object of the present invention is to provide a differential type logic circuit capable of achieving high-speed and low power consumption at a low power supply voltage of less than or equal to 1V.

A first aspect for solving the above problem is a differential type logic circuit comprising a differential circuit, in which the differential circuit is composed of a differential push-pull circuit comprising a depletion type MOSFET and an enhancement type MOSFET of the same polarity.

A second aspect is that, in the first aspect, an input from a differential input terminal to the enhancement type MOSFET and an output from the depletion type MOSFET of a differential output terminal are connected, and the differential push-pull circuit is constructed as a latch type.

A third aspect is that, in the first and second aspects, differential input terminals of the differential push-pull circuit are inputted through a pair of transmission gates comprising a depletion type MOSFET and driven by a clock signal.

A fourth aspect is that, in the third aspect, the differential circuit is replaced with first and second differential push-pull circuits comprising a depletion type MOSFET and an enhancement type MOSFET of the same polarity, the differential output terminal of the first differential push-pull circuit is connected to the differential input terminal of the second differential push-pull circuit through a first pair of transmission gates comprising a depletion type MOSFET and driven by a clock signal, the differential output terminal of the second differential push-pull circuit is connected to the differential input terminal of the first differential push-pull circuit through a second pair of transmission gates comprising a depletion type MOSFET and driven by a reversed clock signal which is reversed of the above clock signal.

A fifth aspect is a differential type logic circuit comprising differential circuits characterized in that the differential circuit is replaced with first and second differential push-pull circuit comprising a depletion type MOSFET and an enhancement type MOSFET of the same polarity, the differential output terminal of the first differential push-pull circuit is connected directly to the differential input terminal of the second differential push-pull circuit, the differential input terminal of the first differential push-pull circuit is inputted through a pair of transmission gates comprising a depletion type MOSFET and driven by a clock signal, and inside the second differential push-pull circuit, input from the differential input terminal to the enhancement type MOSFET and output to the differential output terminal from the depletion type MOSFET are connected, forming a latch type.

A sixth aspect is, in the fifth aspect, further comprising third and fourth differential push-pull circuits comprising a depletion type MOSFET and an enhancement type MOSFET of the same polarity, in which the differential output terminal of the second differential push-pull circuit is connected to the differential input terminal of the third differential push-pull circuit through a first pair of transmission gates comprising a depletion type MOSFET and driven by a clock signal, the differential output terminal of the third differential push-pull circuit is connected directly to the differential input terminal of the fourth differential push-pull circuit, the differential output terminal of the fourth differential push-pull circuit is connected to the differential input terminal of the first differential push-pull circuit through a second pair of transmission gates comprising a depletion type MOSFET and driven by a reversed clock signal which is reversed of the clock signal, and inside the fourth differential push-pull circuit, input from the differential input terminal to the enhancement type MOSFET and output to the differential output terminal from the depletion type MOSFET are connected, forming a latch type.

A seventh aspect is, in the first or second aspect, further comprising a CMOS inverter circuit in which the differential output terminal of the differential circuit is connected with a differential input terminal, and a threshold voltage of the MOSFET constituting the CMOS inverter circuit is set to the same as or higher than that of the enhancement type MOSFET and smaller than about ½ of the power supply voltage.

An eighth aspect is, in the fourth aspect, the differential output terminal of the second differential push-pull circuit is connected to a differential input terminal of the CMOS inverter pair circuit.

A ninth aspect is, in the sixth aspect, the differential output terminal of the fourth differential push-pull circuit is connected to a differential input terminal of the CMOS inverter pair circuit.

A tenth aspect is, in the seventh or eighth aspect, a CMOS logic circuit is connected at a post stage of the CMOS inverter pair circuit, a threshold voltage of MOSFET constituting the CMOS logic circuit is set higher than a threshold voltage of MOSFET constituting the CMOS inverter pair circuit.

An eleventh aspect is, in any one of the seventh to tenth aspects, power supply voltage is supplied through a power FET controlled by a sleep control signal.

A twelfth aspect is, in any one of the first to eleventh aspects, FETs constituting the circuit are those of SOI structure.

From the above description, according to the present invention, it is possible to achieve high speed and low power consumption at a low supply voltage of less than or equal to 1V.

The above and other objects, features and advantages of the present invention will become more apparent from the following description of embodiments thereof taken in conjunction with the accompanying drawings.

BRIEF DESCRIPTION OF THE DRAWINGS

FIGS. 2A and 2B are circuit diagrams showing a differential type logic circuit of a first embodiment of the present invention, in which FIG. 2A is a differential push-pull circuit, and FIG. 2B is a diagram showing a circuit in which a CMOS inverter pair circuit is added to the output of the differential push-pull circuit;

FIGS. 3A and 3B is a circuit diagram showing the differential type logic circuit of a second embodiment according to the present invention in which FIG. 3A is a differential push-pull circuit, and FIG. 3B is a diagram showing a circuit in which a CMOS inverter pair circuit is added to the output of the differential push-pull circuit;

FIGS. 4A and 4B is a circuit diagram showing the differential type logic circuit of a third embodiment according to the present invention in which FIG. 4A is a differential push-pull circuit, and FIG. 4B is a diagram showing a frequency divider circuit;

FIGS. 5A and 5B is a circuit diagram showing the differential type logic circuit of a fourth embodiment according to the present invention in which FIG. 5A is a differential push-pull circuit, and FIG. 5B is a diagram showing a frequency divider circuit;

FIG. 8 is a diagram for explaining an experimental example;

FIG. 9 is a diagram for explaining a latch function of the differential type logic circuit of the third and fourth embodiments according to the present invention.

DESCRIPTION OF THE PREFERRED EMBODIMENTS

Figure 1:
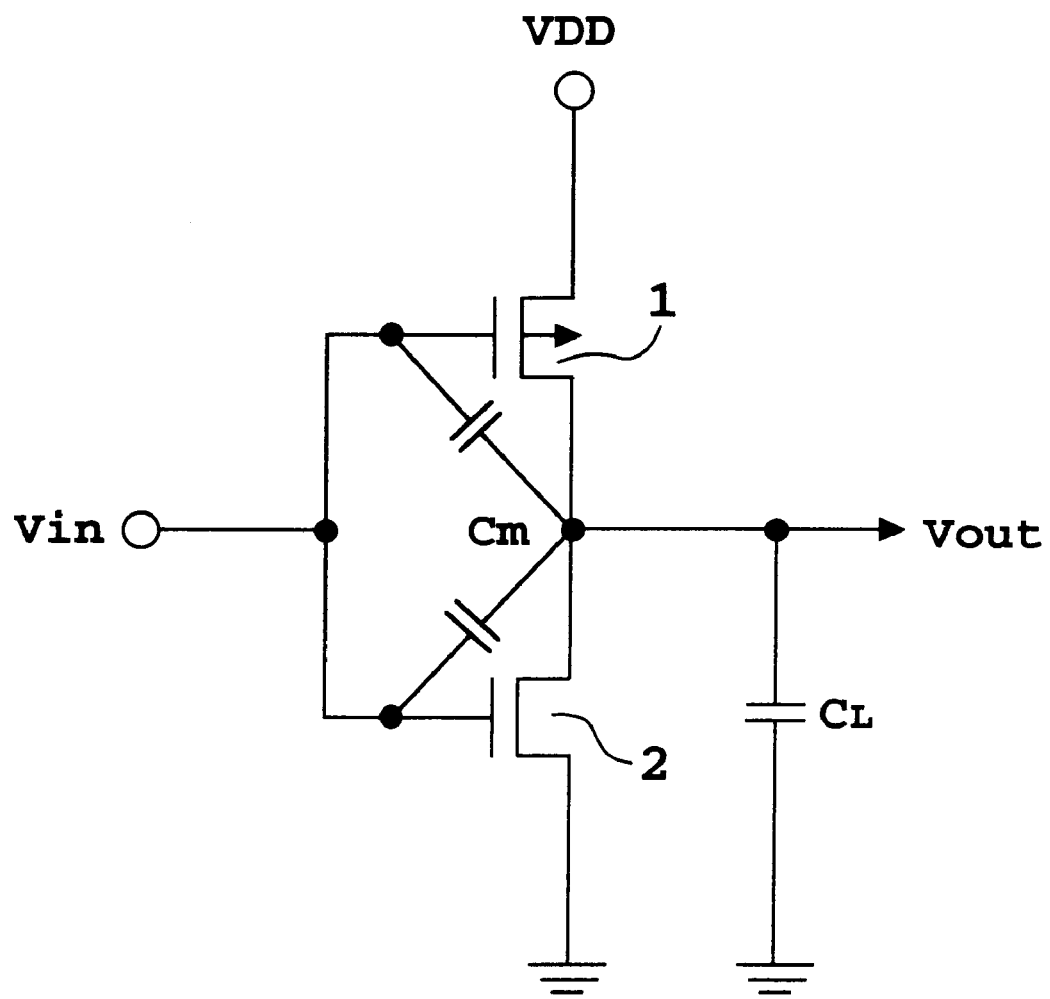
FIG. 1 is a circuit diagram of a conventional CMOS inverter circuit.

FIG. 1 is a diagram showing a conventional CMOS inverter circuit related to the present invention, which comprises enhancement type PMOSFET 1 and NMOSFET 2.

In this circuit, in the case of being operated at a high speed with a low power supply voltage, when the amplitude of the input signal is decreased to lower than the power supply voltage level, since amplification action is performed up to the power supply voltage level by the CMOS inverter circuit, this results in an increased delay time. Further, even when the amplitude of the input signal is at the power supply voltage level, a delay time due to a capacity Cm between input and output of the CMOS inverter circuit is a substantial bottleneck. This is because the capacity Cm between gate and drain of the two FET constituting the CMOS inverter circuit functions as Miller effect which equivalently increases a load capacity CL and increases the delay time.

In the following, embodiments of the present invention will be described in detail with reference to the drawings. In the respective drawings, parts having the same functions are indicated by the same reference symbols.

[First Embodiment]

Figure 2A:
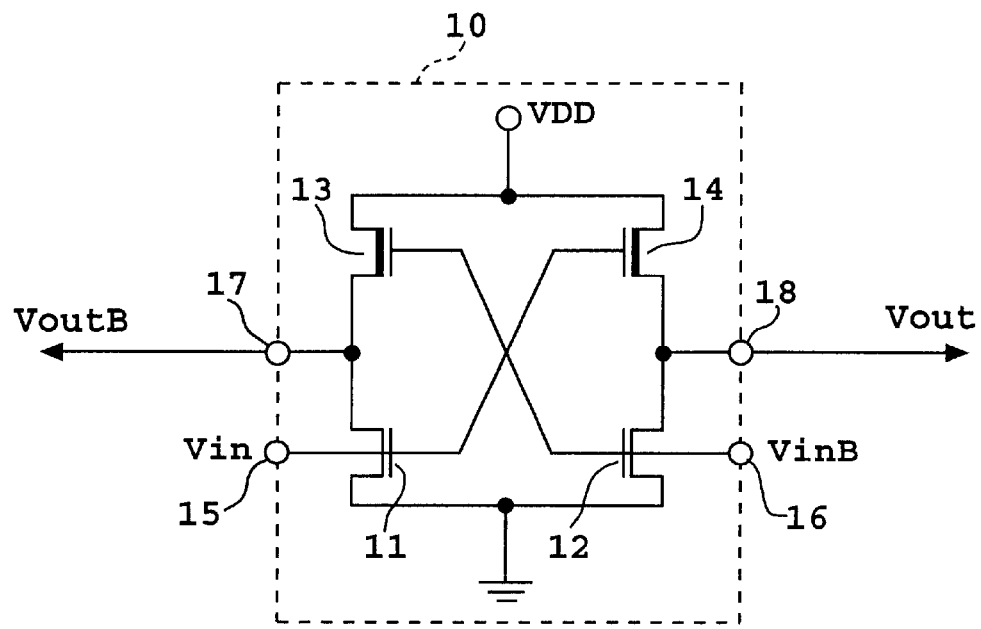
Figure 2B:
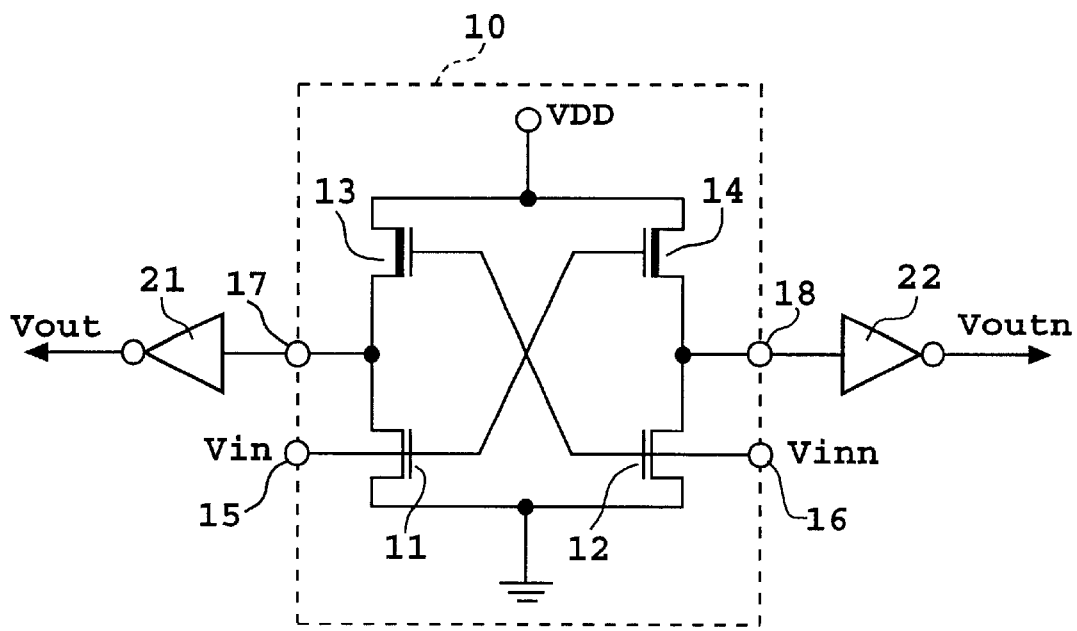

FIGS. 2A and 2B are circuit diagrams showing a differential type logic circuit of a first embodiment of the present invention. In FIG. 2A, numeral 10 is a differential push-Pull circuit (differential circuit). The differential push-pull circuit 10 comprises enhancement type NMOSFETs 11 and 12 with the source grounded and depletion type NMOSFETs 13 and 14 with the drain connected to the VDD supply terminal. That is, FET 11 and FET 13, PET 12 and FET 14 are respectively connected in series between the supply terminal and ground, the gates of FFET 11 and PET 14 are commonly connected to an input terminal 15 of an input Vin, gates of PET 12 and FET 13 are commonly connected to an input terminal 16 of an input VinB, common connection point of FET 11 and FET 13 is connected to an output terminal 17 of an output VoutB, and common connection point of FET 12 and PET 14 is connected to an output terminal 18 of an output Vout. The input terminals 15 and 16 function as differential input terminals and the output terminals 17 and 18 as differential output terminals.

In this circuit, a threshold voltage Vthne (10) of the enhancement type NMOSFETs 11 and 12 and a threshold voltage Vthnd (10) of the depletion type NMOSFETs 13 and 14 are set to Vthne(10)≧0, Vthnd(10)<0.

In this circuit, for example, in the differential push-pull circuit 10, when the signal of the input terminal 15 of the input Vin goes to "H" and the signal of the input terminal 16 of the input VinB to "L", an internal resistance of the FET 11 decreases and an internal resistance of FET 13 increases, and a potential of the output terminal 17 of the output VoutB decreases. Further, the internal resistance of the FET 12 increases, the internal resistance of the FET 14 decreases, and the potential of the output terminal 18 of the output Vout increases.

Here, since the threshold voltages of the respective FETs are set as above, and the differential push-pull circuit 10 is differentially operated, even when the amplitude of the input signal ("H" level) is decreased to lower than the supply voltage VDD, it can be detected at a high speed. Further, since a capacity between input and output of the differential push-pull circuit 10 is a half that of the case shown in FIG. 1, an increase in delay time due to Miller effect can be prevented, thereby achieving high-speed operation.

In FIG. 2B, numeral 10 is a differential push-pull circuit (differential circuit), 21 and 22 are CMOS inverter circuits constituting CMOS inverter pair circuits 20 (see FIGS. 6 and 7 described later). The differential push-pull circuit 10 comprises enhancement type NMOSFETs 11 and 12 with their sources grounded and depletion type NMOSFETs 13 and 14 with their drains connected to the VDD supply terminal. That is, FET 11 and FET 13, FET 12 and FET 14 are connected in series between the supply terminal and ground, the gates of FET 11 and FET 14 are commonly connected to a non-reversed input terminal 15, the gates of FET 12 and FET 13 are commonly connected to a reversed input terminal 16, the common connection point of PET 11 and FET 13 is connected to a reversed output terminal 17, and the common connection point of FET 12 and FET 14 is connected to a non-reversed output terminal 18. Further, the reversed output terminal 17 is connected to the CMOS inverter circuit 21, and the non-reversed output terminal 18 is connected to the CMOS inverter circuit 22. The input terminals 15 and 16 function as differential input terminals, and the output terminals 17 and 18 as differential output terminals.

In this circuit, the threshold voltage Vthne (10) of the enhancement type NMOSFETs 11 and 12 and the threshold voltage Vthnd (10) of the depletion type NMOSFETs 13 and 14 are se to Vthne(10)≧0, Vthnd(10)<0.

And a threshold voltage Vthpe (20) of the enhancement type PMOSFET constituting the CMOS inverter circuits 21 and 22 and a threshold voltage Vthne (20) of NMOSFET are set to

|Vthpe (20)|≧Vthne (10), Vthne (20)≧Vthne (10).

The upper limit value of the threshold voltages Vthpe (20)| and Vthne (20) is 50% of the supply voltage VDD.

In this circuit, for example, in the differential push-pull circuit 10, when signal of the non-reversed input terminal 15 goes to "H", and signal of the reversed input terminal 16 to "L", internal resistance of the FET 11 decreases, and internal resistance of the FET 13 increases, reducing the potential of the reversed output terminal 17. Further, internal resistance of the FET 12 increases and internal resistance of the FET 14 decreases, increasing the potential of the non-reversed output terminal 18.

Here, since the threshold voltages of the respective FETs are set as above, and the differential push-pull circuit 10 is differentially operated, even when the amplitude of the input signal ("H" level) is decreased to lower than the supply voltage VDD, it can be detected at a high speed, thereby achieving the amplitude of the supply voltage VDD level by the CMOS inverter circuits 21 and 22 of the post stage. Further, since a capacity between input and output of the differential push-pull circuit 10 is a half that of the case shown in FIG. 1, an increase in delay time due to Miller effect can be prevented, thereby achieving high-speed operation.

[Second Embodiment]

Figure 3A:
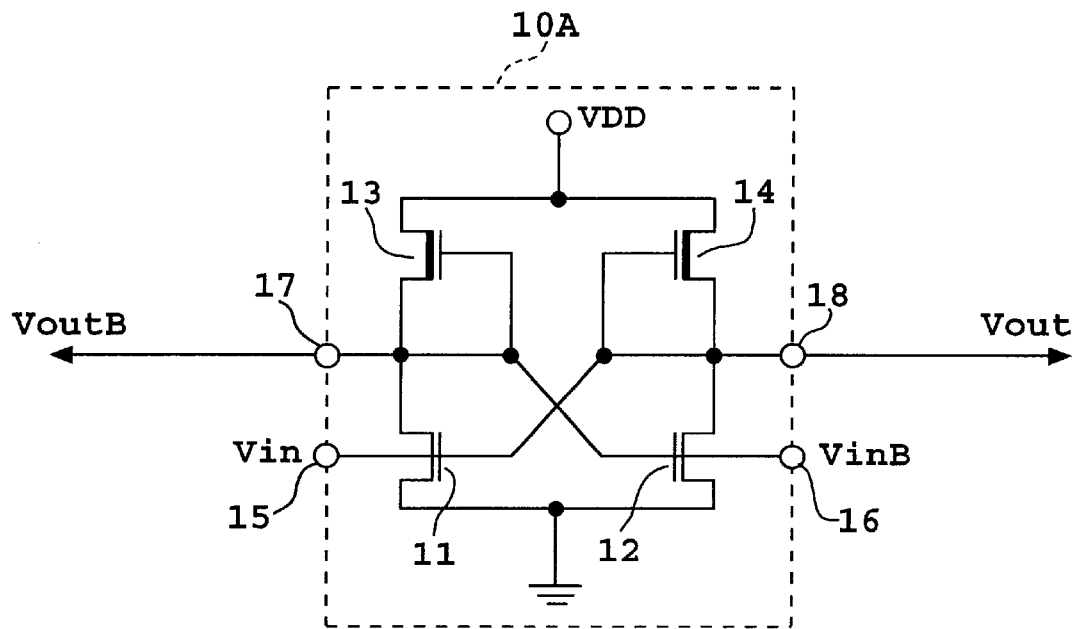
Figure 3B:
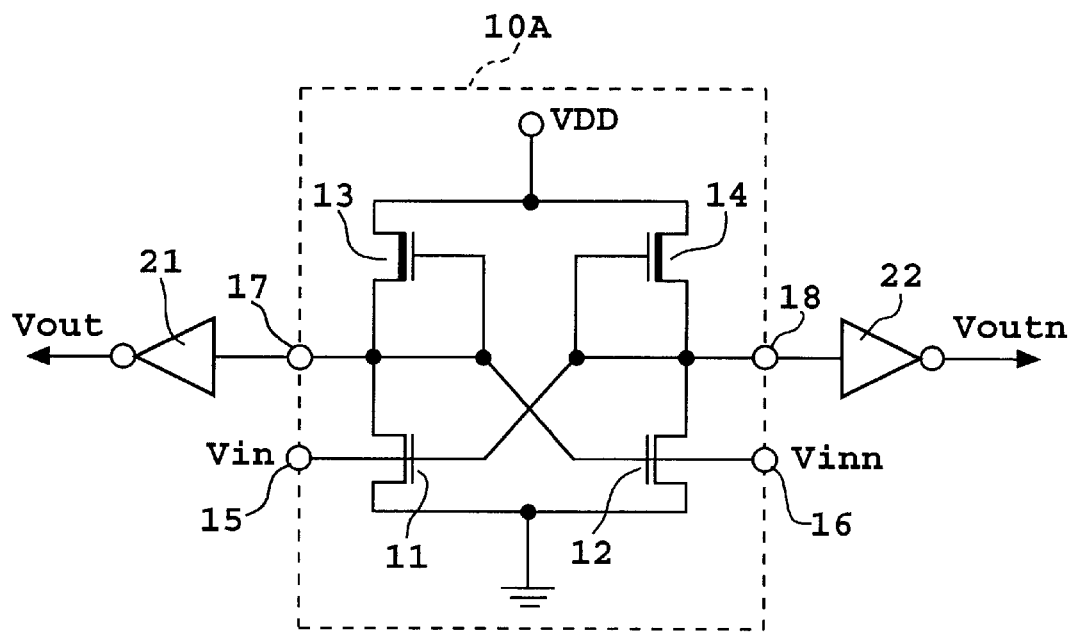

FIGS. 3A and 3B are circuit diagrams showing the differential type logic circuit according to a second embodiment of the present invention. FIG. 3A is a modification of the differential type logic circuit shown in FIG. 2A, wherein the input terminal 15 and the output terminal 18 are connected, and the input terminal 16 and the output terminal 17 are connected. This modification comprises a differential push-pull circuit 10A.

By this construction, the differential push-pull circuit 10A exhibits a latch function, and the amplification factor thereof can be even further increased compared to the differential push-pull circuit 10 shown in FIG. 2A.

FIG. 3B is a modification of the differential type logic circuit shown in FIG. 2B, wherein the input terminal 15 and the output terminal 18 are connected, and the input terminal 16 and the output terminal 17 are connected. This modification comprises the differential push-pull circuit 10A. Then, the reversed output terminal 17 is connected to the CMOS inverter circuit 21, and the non-reversed output terminal 18 is connected to the CMOS inverter circuit 22.

By this construction, the differential push-pull circuit 10A exhibits a latch function, and the amplification factor thereof can be even further increased compared to the differential push-pull circuit 10 shown in FIG. 2B, thereby achieving a supply voltage level amplitude by the CMOS inverter circuits 21 and 22 of the post stage.

[Third Embodiment]

Figure 4A:
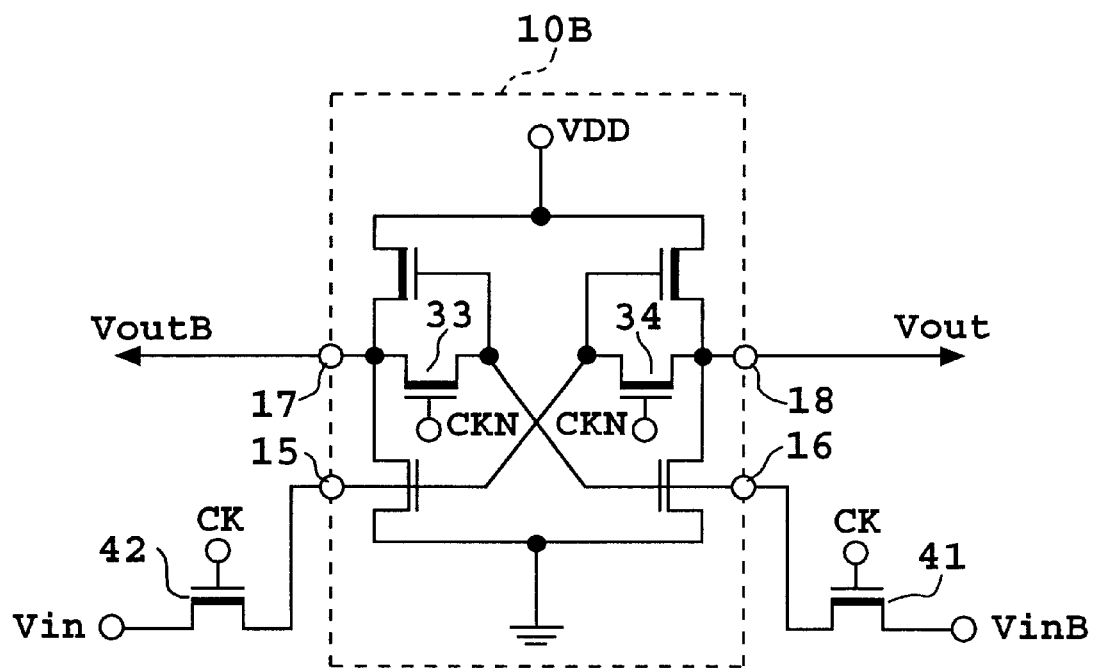
Figure 4B:
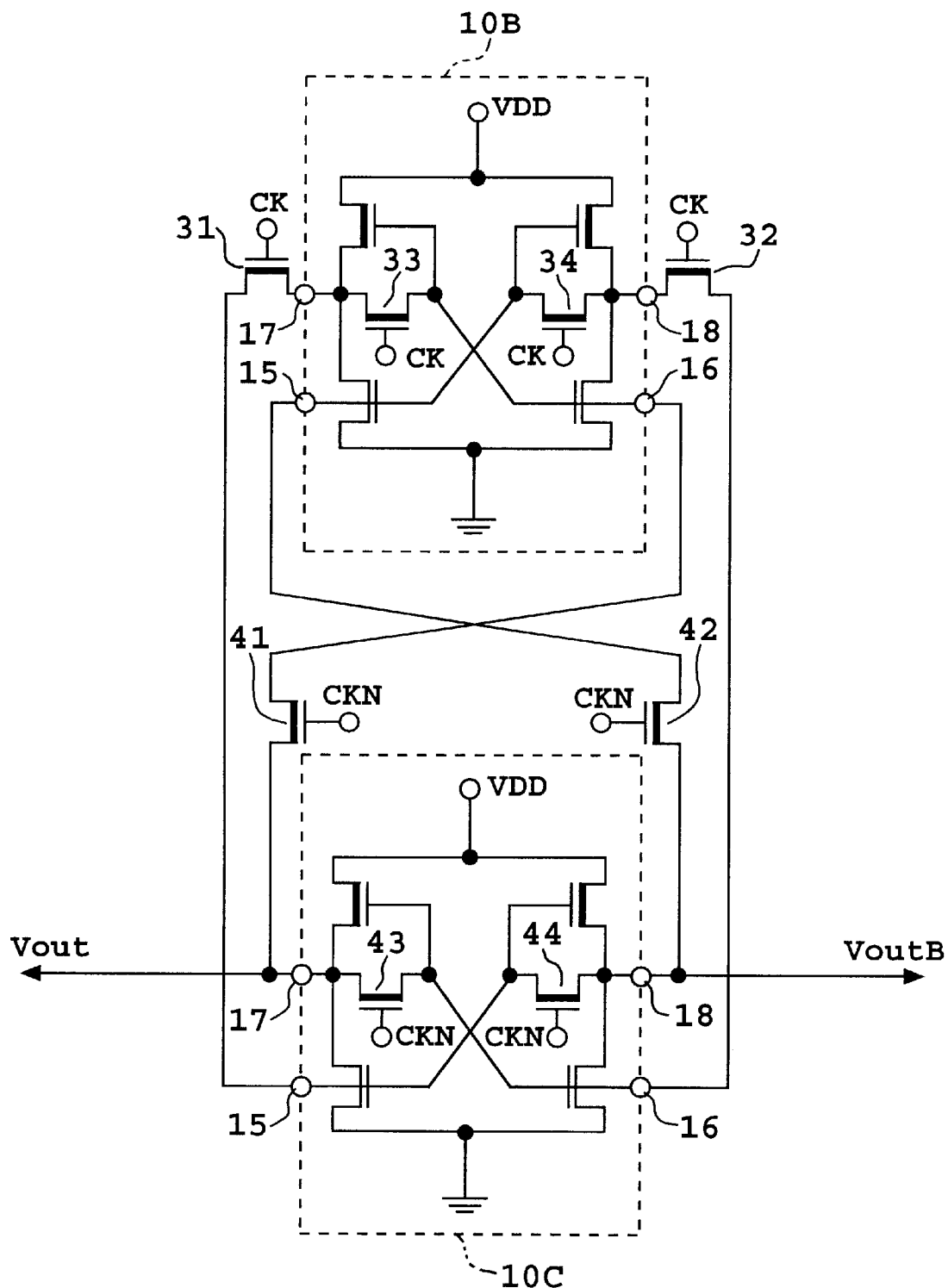

FIGS. 4A and 4B and FIG. 9 are circuit diagrams showing the differential type logic circuit according to a third embodiment of the present invention. FIG. 4A is a circuit diagram showing a differential type logic circuit, and 10B is a differential push-pull circuit having a latch function. 33 and 34 are transmission gates comprising depletion type NMOSFET controlled by a clock CKN (reversed clock CK signal), and 41 and 42 are transmission gates comprising depletion type NMOSFET controlled by a clock CK. Threshold voltages of these FETs 33, 34, 41 and 42 are the same as those of the above-described FETs 13 and 14. The differential push-pull circuit 10B has a latch function as shown in FIG. 9. The FETs 33, 34, 41 and 42 may be enhancement type NMOSFETs.

FIG. 4B is a circuit diagram showing a differential type logic circuit, applied to a ½ frequency divider which divides frequency of input signal into ½ and outputs it. 10B and 10C are differential push-pull circuits having a latch function. 31 to 34 are transmission gates comprising depletion type NMOSFET controlled by the clock CK, and 41 to 44 are transmission gates comprising depletion type NMOSFET controlled by a reversed phase clock CKN (reversed clock CK signal). The threshold voltages of 41 to 44 are the same as those of the above-described FETs 13 and 14.

Here, the differential output terminals 17 and 18 of the differential push-pull circuit 10B are connected to differential input terminals 15 and 16 of the differential push-pull circuit 10C through the transmission gates 31 and 32, and the differential output terminals 17 and 18 of the differential push-pull circuit 10C are cross-connected to differential input terminals 15 and 16 of the differential push-pull circuit 10B through the transmission gates 41 and 42. Then, by driving the FETs 31 to 34 by the clock CK and driving the FETs 41 to 44 by the reversed phase clock CKN a ½ frequency divided clock signal CK is taken out from the differential push-pull circuit 10C and outputted from the output terminals 17 and 18. Use of the depletion type NMOSFET in the transmission gates 31 to 34 and 41 to 44 is because it can be operated at a high speed with a small threshold voltage. Further, the transmission gates 33, 34, 43 and 44 are not necessarily required.

Further, in FIG. 4B, outputs from the output terminals 17 and 18 may be inputted to the respective CMOS inverter circuits 21 and 22, thereby achieving the amplitude of the supply voltage VDD level by the CMOS inverter circuits 21 and 22 of the post stage.

[Fourth Embodiment]

Figure 5A:
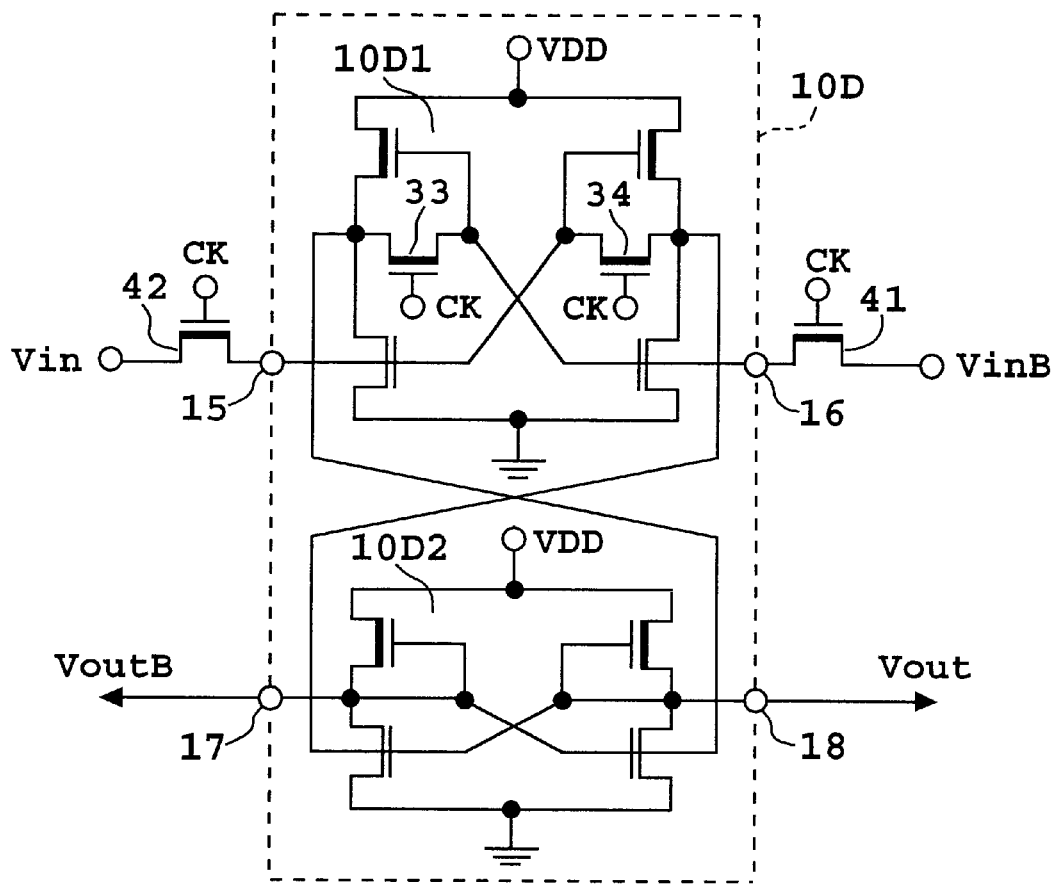
Figure 5B:
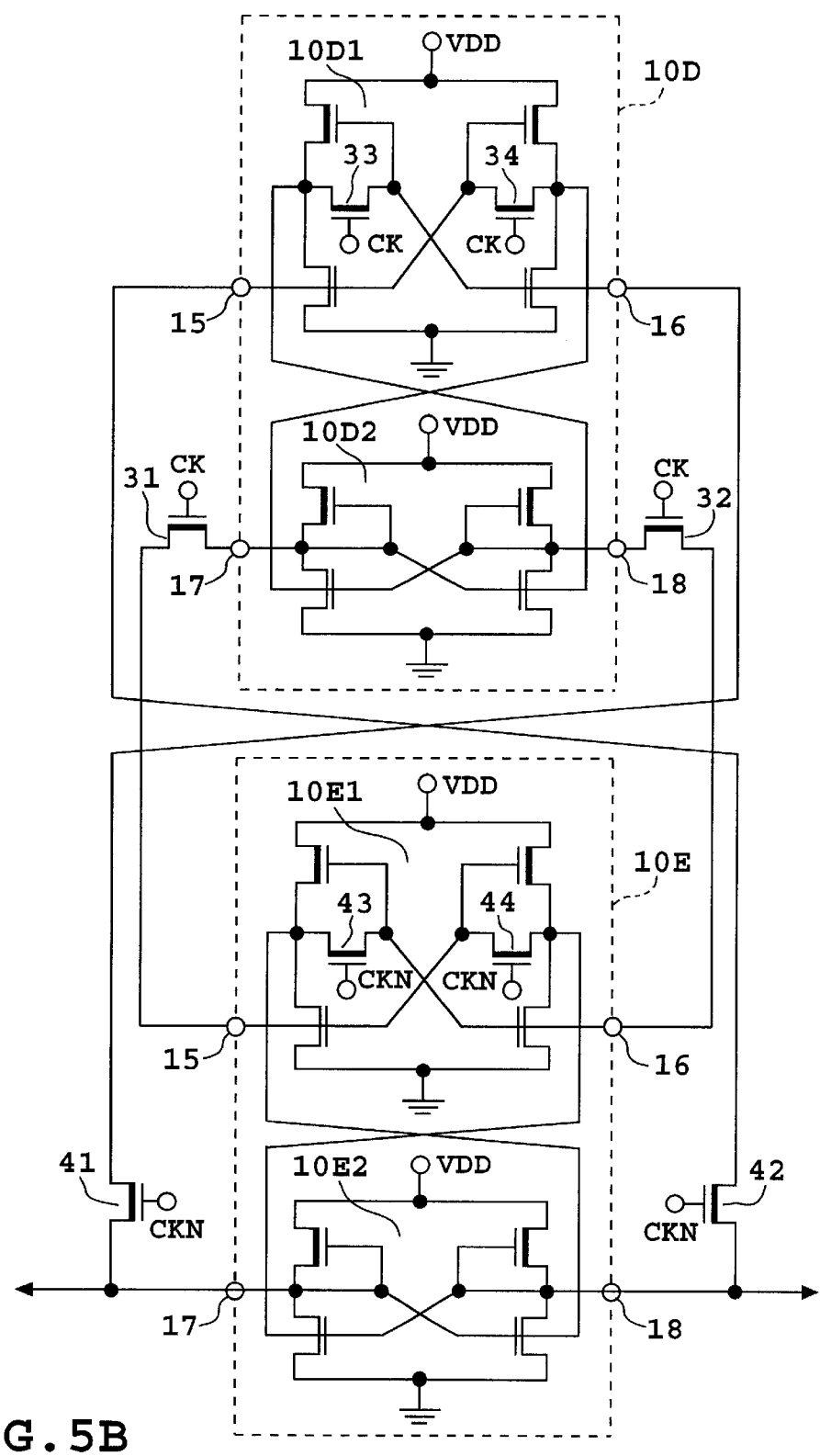

FIGS. 5A and 5B and FIG. 9 are diagrams for explaining the differential type logic circuit according to a fourth embodiment of the present invention. FIG. 5A is a circuit diagram showing a differential type logic circuit, and 10D is a differential push-pull circuit achieved by a two-stage construction. In the differential push-pull circuit 10D, an upper stage differential push-pull circuit 10D1 achieves a latch function (differential push-pull circuit 10B) using the transmission gates 33 and 34, a lower stage differential push-pull circuit 10D2 achieves the latch function by direct connection as shown in FIG. 3A, which is functioned as a buffer (=differential push-pull circuit 10A). The differential push-pull circuit 10D has the latch function as shown in FIG. 9.

FIG. 5B is a circuit diagram showing the differential type logic circuit, applied to a ½ frequency divider as in FIG. 4B. 10D and 10E are respective differential push-pull circuits achieved by a two-stage construction. In the respective differential push-pull circuits 10D and 10E, the upper stage differential push-pull circuits 10D1 and 10E1 achieve the latch function using the transmission gates 33, 34, 43, and 44, the lower stage differential push-pull circuit 10D2 and 10E2 achieve the latch function by direct connection as shown in FIG. 3A, which are functioned as a buffer. The operation is the same as in the circuit of FIG. 4B, however, a higher speed operation can be achieved than the circuit of FIG. 4B. The transmission gates 33, 34, 43, and 44 are not necessarily required.

Further, in FIG. 5B, outputs from the output terminals 17 and 18 may be inputted to the respective CMOS inverter circuits 21 and 22, thereby achieving the amplitude of the supply voltage VDD level by the CMOS inverter circuits 21 and 22 of the post stage.

[Fifth Embodiment]

Figure 6:
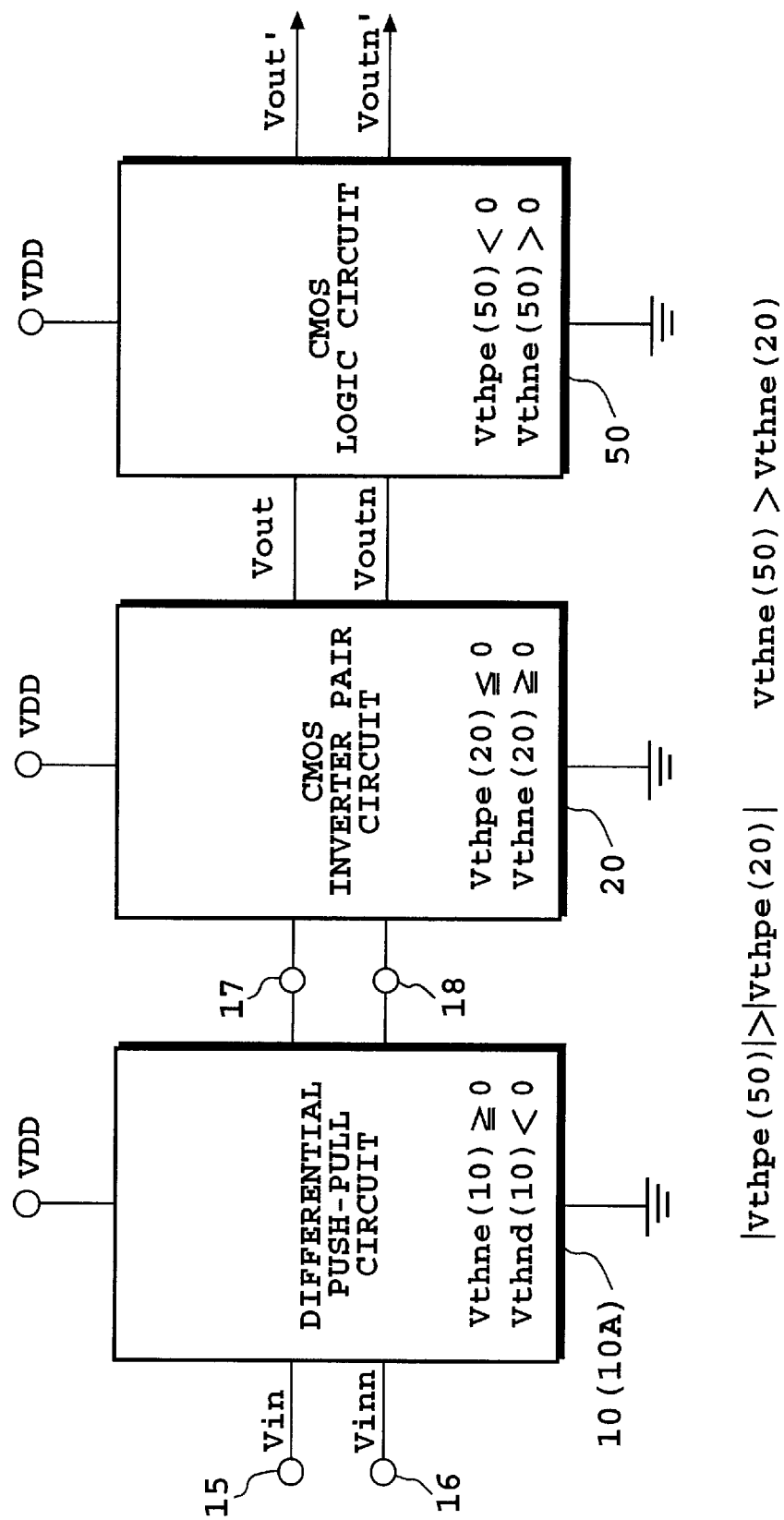
FIG. 6 is a circuit diagram of the differential type logic circuit of a fifth embodiment according to the present invention.

FIG. 6 is a circuit diagram showing the differential type logic circuit according to a fifth embodiment of the present invention, in which in the post stage of the differential push-pull circuit 10 (or 10A), CMOS inverter pair circuit 20 comprising the CMOS inverter circuits 21 and 22 is connected to construct a circuit shown in FIGS. 2A and 2B or FIGS. 3A and 3B, and further in the post stage thereof, a CMOS logic circuit 50 is connected. In the present embodiment, the threshold voltage Vthpe (50) of the PMOSFET constituting this CMOS logic circuit 50 and the threshold voltage Vthne (50) of NMOSFET are greatly set to

|Vthpe (50)|>|Vthpe (20)|, Vthne (50)>Vthne (20) relative to the threshold voltage |Vthpe (20)| of the PMOSFET constituting the CMOS inverter pair circuit 20 and the threshold voltage Vthne (20) of the NMOSFET.

With this circuit, leak current decreases in the CMOS logic circuit 50. By making this CMOS logic circuit 50 as a DFF circuit construction, high-speed and low power consumption demultiplexing circuit or multiplexing circuit can be achieved.

[Sixth Embodiment]

Figure 7:
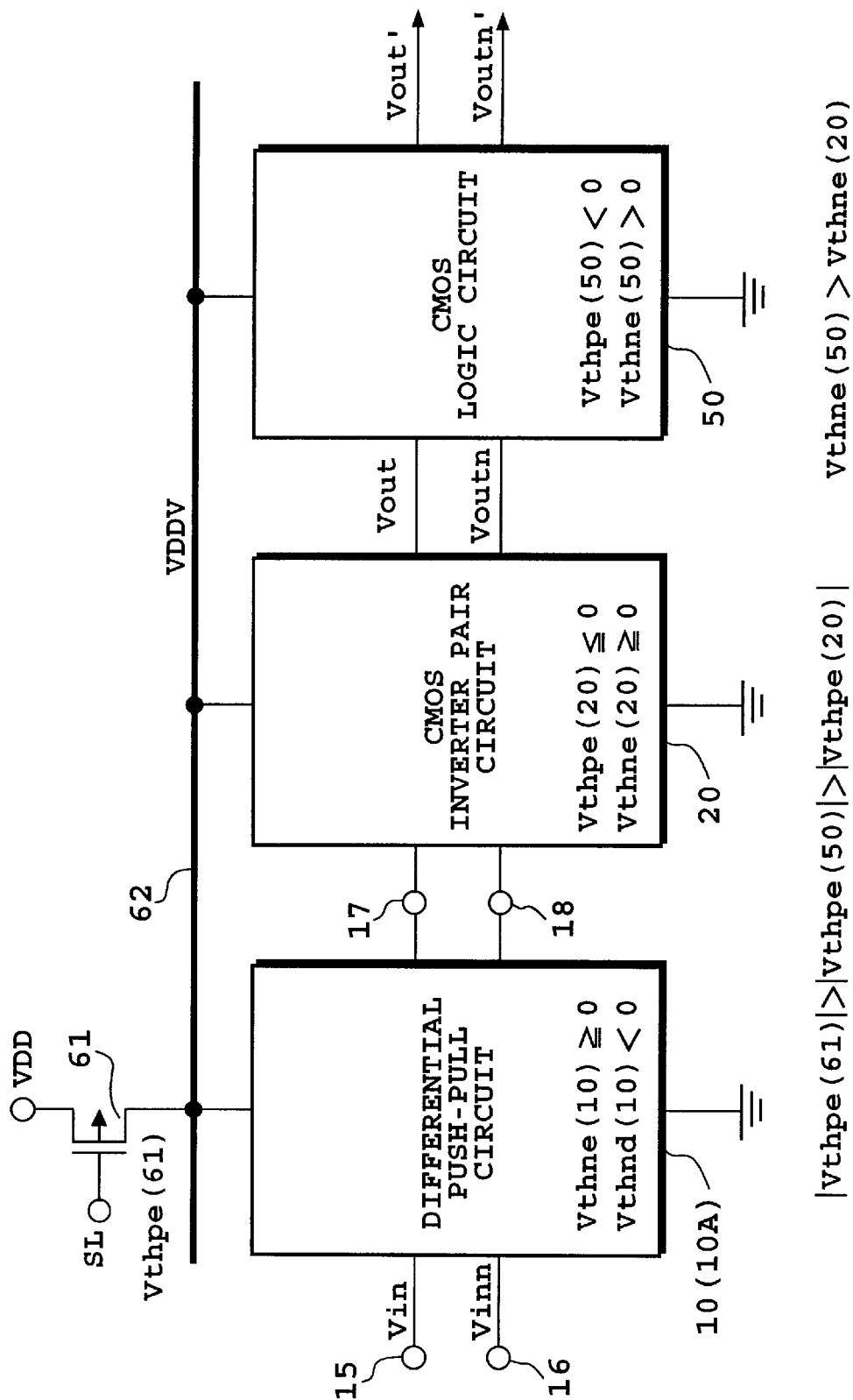
FIG. 7 is a circuit diagram of the differential type logic circuit of a sixth embodiment according to the present invention.

FIG. 7 is a circuit diagram showing the differential type logic circuit according to a sixth embodiment of the present invention. Parts same as in FIG. 6 are indicated by the same symbols. Numeral 61 is an enhancement type power PMOSFET for sleep control in which the threshold voltage Vthpe (61) is set to a high value of

|Vthpe (61)|>|Vthpe (50)| relative to the threshold voltage Vthpe (50) of the PMOSFET constituting the CMOS logic circuit 50. 62 is a second power supply line.

Here, when the differential push-pull circuit 10 (or 10A), the CMOS inverter circuit 20, and the CMOS logic circuit 50 are operated, sleep control signal SL applied to the gate of the power FET 61 is controlled to "L" to supply power VDD to the second power supply line 62, on the other hand, when setting to a stand-by state, the signal is controlled to "H" to discontinue power supply to the second power supply line 62. This reduces leak current and provides low power consumption at the time of stand-by of the respective circuit 10 (or 10A), 20, and 50.

EXPERIMENTAL EXAMPLE

FIG. 8 is a diagram for explaining the experiment of comparing the frequency divider of the prior art construction with the frequency divider of the construction of FIG. 4B and FIG. 5B. The circuit construction is SOI by CMOS/SIMOX technology with a gate length of 0.25 μm, and VDD=0.5V. In the frequency divider of FIG. 4B and FIG. 5B, the threshold voltage is set to as Vthne (10)=0V, Vthnd (10)=−0.2V, and the threshold voltages Vthpe and Vthne of the prior art CMOS construction are set to Vthpe=0V, Vthne=0V. In the frequency divider of FIG. 4B and FIG. 5B, a maximum of more than or equal to two times in the highest operation frequency and a 25% reduction per unit frequency in power consumption can be achieved compared to the frequency divider of the prior art construction.

[Other Embodiments]

In the above description, the depletion type and enhancement type MOSFETs of the differential push-pull circuit 10 are of N type, however, alternatively, P type MOSFET may also be used. In this case, the enhancement type PMOSFET is connected to the VDD side, and the depletion type PMOSFET to the ground side, and the threshold voltage Vthpe of the enhancement type PMOSFET and the threshold voltage Vthpd of the depletion type PMOSFET may be set to Vthpe_0, Vthpd>0.

Further, the differential push-pull circuits 10 and 10A of FIG. 6 and FIG. 7 may be the construction of the frequency divider of FIG. 4B and FIG. 5B.

The present invention has been described in detail with respect to preferred embodiments, and it will now be apparent from the foregoing to those skilled in the art that changes and modifications may be made without departing from the invention in its broader aspect, and it is the intention, therefore, in the appended claims to cover all such changes and modifications as fall within the true spirit of the invention.

What is claimed is:

1. A differential type logic circuit comprising:
    first and second enhancement type MOSFETs having a conductivity, each of said enhancement type MOSFETs having a source, a drain, and a gate;
    third and fourth depletion type MOSFETs having said conductivity, each of said depletion type MOSFETs having a source, a drain and a gate;
    a first input terminal connected to the gates of said first and fourth MOSFETs;
    a second input terminal connected to the gates of said second and third MOSFETs;
    a first output terminal connected at a first node to said first and third MOSFETs; and
    a second output terminal connected at a second node to said second and fourth MOSFETs;
    wherein said depletion type MOSFETs and said enhancement type MOSFETs have a same polarity;
    wherein said first and third MOSFETs are connected in series to said first node, one of said first and third MOSFETs being connected to a voltage source and the other of said first and third MOSFETs being connected directly to a ground;
    wherein said second and fourth MOSFETs are connected in series to said second node, one of said second and fourth MOSFETs being connected to said voltage source and the other of said second and fourth MOSFETs being connected directly to said ground;

wherein said first output terminal is connected to the gates of said second and third MOSFETs, and said second output terminal is connected to the gates of said first and fourth MOSFETs.

2. The differential type logic circuit as claimed in claim 1, further comprising a CMOS inverter pair circuit in which differential output terminals of said differential circuit are connected with differential input terminals of said CMOS inverter pair circuit, and a threshold voltage of MOSFET constituting said CMOS inverter pair circuit is set to the same as or higher than threshold voltages of said enhancement type MOSFETs of said differential push-pull circuit and smaller than about ½ of said voltage source.

3. The differential type logic circuit as claimed in claim 2, wherein a CMOS logic circuit is connected at a post stage of said CMOS inverter pair circuit, and a threshold voltage of MOSFET constituting the CMOS logic circuit is set higher than a threshold voltage of MOSFET constituting said CMOS inverter pair circuit.

4. The differential type logic circuit as claimed in claim 3, wherein FETs constituting said circuit comprise an SOI structure.

5. The differential type logic circuit as claimed in claim 2, wherein a power supply voltage is supplied through a power FET controlled by a sleep control signal.

6. The differential type logic circuit as claimed in claim 5, wherein FETs constituting said circuit comprise an SOI structure.

7. The differential type logic circuit as claimed in claim 1, wherein said conductivity is N type conductivity, said first and second MOSFETs are connected directly to said ground, and said third and fourth MOSFETs are connected to said voltage source.

8. The differential type logic circuit as claimed in claim 1, wherein said conductivity is P type conductivity, said first and second MOSFETs are connected to said voltage source, and said third and fourth MOSFETs are connected directly to ground.

9. A differential type logic circuit comprising a differential circuit, said differential circuit comprising a differential push-pull circuit, said differential push-pull circuit comprising depletion type MOSFETs and enhancement type MOSFETs of a same polarity;
wherein differential input terminals of said differential push-pull circuit are connected to said enhancement type MOSFETs and differential output terminals of said differential push-pull circuit are connected to said depletion type MOSFETs such that said differential push-pull circuit is a latch type circuit; and
wherein said differential input terminals of said differential push-pull circuit are inputted through a pair of transmission gates comprising depletion type MOSFETs and driven by a clock signal.

10. The differential type logic circuit as claimed in claim 9, wherein said differential push-pull circuit is a first differential push-pull circuit;
wherein said differential circuit further comprises a second differential push-pull circuit comprising depletion type MOSFETs and enhancement type MOSFETs of the same polarity;
wherein differential output terminals of said first differential push-pull circuit are connected to differential input terminals of said second differential push-pull circuit through a first pair of transmission gates comprising depletion type MOSFETs and driven by a clock signal; and
wherein differential output terminals of said second differential push-pull circuit are connected to differential input terminals of said first differential push-pull circuit through a second pair of transmission gates comprising depletion type MOSFETs and driven by a reversed clock signal which is reversed of said clock signal.

11. The differential type logic circuit as claimed in claim 10, wherein said differential output terminals of said second differential push-pull circuit are connected to differential input terminals of a CMOS inverter pair circuit.

12. The differential type logic circuit as claimed in claim 11, wherein a CMOS logic circuit is connected at a post stage of said CMOS inverter pair circuit, and a threshold voltage of MOSFET constituting the CMOS logic circuit is set higher than a threshold voltage of MOSFET constituting said CMOS inverter pair circuit.

13. The differential type logic circuit as claimed in claim 11, wherein a power supply voltage is supplied through a power FET controlled by a sleep control signal.

14. The differential type logic circuit as claimed in claim 13, wherein FETs constituting said circuit comprise an SOL structure.

15. The differential type logic circuit as claimed in claim 12, wherein a power supply voltage is supplied through a power FET controlled by a sleep control signal.

16. The differential type logic circuit as claimed in claim 15, wherein FETs constituting said circuit comprise an 501 structure.

17. A differential type logic circuit comprising a differential circuit, said differential circuit comprising a differential push-pull circuit, said differential push-pull circuit comprising depletion type MOSFETs and enhancement type MOSFETs of a same polarity;
wherein differential input terminals of said differential push-pull circuit are connected to a pair of transmission gates comprising depletion type MOSFETs and driven by a clock signal.

18. The differential type logic circuit as claimed in claim 17, wherein said differential push-pull circuit is a first differential push-pull circuit;
wherein said differential circuit further comprises a second differential push-pull circuit comprising depletion type MOSFETs and enhancement type MOSFETs of the same polarity;
wherein differential output terminals of said first differential push-pull circuit are connected to differential input terminals of said second differential push-pull circuit through a first pair of transmission gates comprising depletion type MOSFETs and driven by a clock signal; and
wherein differential output terminals of said second differential push-pull circuit are connected to differential input terminals of said first differential push-pull circuit through a second pair of transmission gates comprising depletion type MOSFETs and driven by a reversed clock signal which is reversed of said clock signal.

19. The differential type logic circuit as claimed in claim 18, wherein said differential output terminals of said second differential push-pull circuit are connected to differential input terminals of a CMOS inverter pair circuit.

20. The differential type logic circuit as claimed in claim 19, wherein a CMOS logic circuit is connected at a post stage of said CMOS inverter pair circuit, and a threshold voltage of MOSFET constituting the CMOS logic circuit is set higher than a threshold voltage of MOSFET constituting said CMOS inverter pair circuit.

21. The differential type logic circuit as claimed in claim 20, wherein a power supply voltage is supplied through a power FET controlled by a sleep control signal.

22. The differential type logic circuit as claimed in claim 21, wherein FETs constituting said circuit comprise an SOI structure.

23. The differential type logic circuit as claimed in claim 19, wherein a power supply voltage is supplied through a power FET controlled by a sleep control signal.

24. The differential type logic circuit as claimed in claim 23, wherein FETs constituting said circuit comprise an SOI structure.

25. A differential type logic circuit comprising a differential circuit, said differential circuit comprising first and second differential push-pull circuits, said first and second differential push-pull circuits comprising depletion type MOSFETs and enhancement type MOSFETs of a same polarity;

wherein differential output terminals of said first differential push-pull circuit are connected directly to differential input terminals of said second differential push-pull circuit;

wherein differential input terminals of said first differential push-pull circuit are inputted through a second pair of transmission gates; and wherein for said second differential push-pull circuit, differential input terminals are connected to said enhancement type MOSFETs and differential output terminals are connected to said depletion type MOSFETs to form a latch type circuit.

26. The differential type logic circuit as claimed in claim 25, further comprising third and fourth differential push-pull circuits, said third and fourth differential push-pull circuits comprising depletion type MOSFETs and enhancement type MOSFETs of the same polarity;

wherein differential output terminals of said second differential push-pull circuit are connected to differential input terminals of said third differential push-pull circuit through a first pair of transmission gates comprising depletion type MOSFETs and driven by a clock signal;

wherein differential output terminals of said third differential push-pull circuit are connected directly to differential input terminals of said fourth differential push-pull circuit;

wherein differential output terminals of said fourth differential push-pull circuit are connected to differential input terminals of said first differential push-pull circuit through said second pair of transmission gates, said second pair of transmission gates comprising depletion type MOSFETs and driven by a reversed clock signal which is reversed of said clock signal; and wherein for said fourth differential push-pull circuit, differential input terminals are connected to said enhancement type MOSFETs and differential output terminals are connected to said depletion type MOSFETs to form a latch type circuit.

27. The differential type logic circuit as claimed in claim 26, wherein said differential output terminals of said fourth differential push-pull circuit are connected to differential input terminals of CMOS inverter pair circuit.

28. The differential type logic circuit as claimed in claim 27, wherein a CMOS logic circuit is connected at a post stage of said CMOS inverter pair circuit, and a threshold voltage of MOSFET constituting the CMOS logic circuit is set higher than a threshold voltage of MOSFET constituting said CMOS inverter pair circuit.

29. The differential type logic circuit as claimed in claim 28, wherein a power supply voltage is supplied through a power FET controlled by a sleep control signal.

30. The differential type logic circuit as claimed in claim 29, wherein FETs constituting said circuit comprise an SOI structure.

31. The differential type logic circuit as claimed in claim 27, wherein a power supply voltage is supplied through a power FET controlled by a sleep control signal.

32. The differential type logic circuit as claimed in claim 31, wherein FETs constituting said circuit comprise an SOI structure.

* * * * *